US012657105B2

(12) United States Patent
Rakshit et al.

(10) Patent No.: US 12,657,105 B2
(45) Date of Patent: Jun. 16, 2026

(54) MACHINE PERFORMANCE IDENTIFICATION AND ISSUE WORKAROUND

(71) Applicant: Kyndryl, Inc., New York, NY (US)

(72) Inventors: Sarbajit K. Rakshit, Kolkata (IN); Laxmikantha Sai Nanduru, Secunderabad (IN); Pritpal Arora, Bangalore (IN)

(73) Assignee: Kyndryl, Inc., New York, NY (US)

( * ) Notice: Subject to any disclaimer, the term of this patent is extended or adjusted under 35 U.S.C. 154(b) by 1127 days.

(21) Appl. No.: 17/553,076

(22) Filed: Dec. 16, 2021

(65) Prior Publication Data

US 2023/0195592 A1 Jun. 22, 2023

(51) Int. Cl.
| | |
|---|---|
| *G06F 11/34* | (2006.01) |
| *G06F 30/27* | (2020.01) |
| *G06N 20/00* | (2019.01) |

(52) U.S. Cl.
CPC .......... *G06F 11/3457* (2013.01); *G06F 30/27* (2020.01); *G06N 20/00* (2019.01)

(58) Field of Classification Search
CPC ...... G06F 11/3457; G06F 30/27; G06N 20/00
USPC ........................................................ 703/21
See application file for complete search history.

(56) References Cited

U.S. PATENT DOCUMENTS

| | | | |
|---|---|---|---|
| 5,136,528 | A | 8/1992 | Fordham et al. |
| 9,671,777 | B1 * | 6/2017 | Aichele .................. B25J 9/1666 |

| | | | | |
|---|---|---|---|---|
| 10,318,904 | B2 * | 6/2019 | Johnson ................. G06Q 50/14 |
| 11,463,322 | B1 * | 10/2022 | Sha ...................... H04L 41/5096 |
| 11,526,638 | B1 * | 12/2022 | Contreras .............. G06Q 50/06 |
| 2016/0247129 | A1 * | 8/2016 | Song ...................... G06Q 10/20 |
| 2018/0137219 | A1 * | 5/2018 | Goldfarb ................ G06N 3/126 |
| 2019/0087544 | A1 | 3/2019 | Peterson |
| 2020/0118053 | A1 * | 4/2020 | Chapin ............ G06Q 10/06315 |
| 2020/0364387 | A1 * | 11/2020 | Roemerman ........... G06F 30/20 |
| 2021/0096975 | A1 * | 4/2021 | DeLuca .............. G06F 11/3409 |
| 2021/0109837 | A1 * | 4/2021 | Rakshit .............. G06F 11/3476 |
| 2021/0149380 | A1 * | 5/2021 | Rakshit ............ G05B 19/41875 |
| 2021/0157312 | A1 * | 5/2021 | Cella ...................... G06Q 30/06 |
| 2021/0224682 | A1 * | 7/2021 | Al-Nasser ............. G01V 20/00 |
| 2021/0357422 | A1 * | 11/2021 | Cella .................... G06N 3/0464 |
| 2022/0013199 | A1 * | 1/2022 | Kozloski ................ G16H 50/20 |
| 2022/0082389 | A1 * | 3/2022 | Patnaikuni ......... G01C 21/3407 |

(Continued)

FOREIGN PATENT DOCUMENTS

| | | |
|---|---|---|
| CN | 103745107 | 4/2014 |
| CN | 104238453 | 12/2014 |

OTHER PUBLICATIONS

Bambura et al. (Implementation of Digital Twin for Engine Block Manufacturing Processes, Applied Science, 2020, pp. 1-10). (Year: 2020).*

(Continued)

*Primary Examiner* — Iftekhar A Khan

(74) *Attorney, Agent, or Firm* — Erik Swanson; Andrew D. Wright; Calderon Safran & Wright P.C.

(57) ABSTRACT

A method includes identifying, by a computing device, activities of a machine using a digital twin of a machine; running, by the computing device, simulations of the activities on the digital twin; determining, by the computing device, a performance issue in the machine using the simulations; and deploying, by the computing device, a capability to address the performance issue.

18 Claims, 5 Drawing Sheets

(56)        References Cited

U.S. PATENT DOCUMENTS

| | | | |
|---|---|---|---|
| 2022/0092234 A1* | 3/2022 | Karri | G06F 30/18 |
| 2022/0164502 A1* | 5/2022 | Pei | G06N 5/02 |
| 2022/0165438 A1* | 5/2022 | Marzorati | G05B 13/04 |
| 2022/0197231 A1* | 6/2022 | Kim | G05B 23/0254 |
| 2022/0365518 A1* | 11/2022 | Wang | G06Q 50/04 |
| 2023/0004149 A1* | 1/2023 | Dehghanimohammadabadi | G05B 13/0265 |
| 2023/0022733 A1* | 1/2023 | Kaul | G05B 13/028 |
| 2023/0062028 A1* | 3/2023 | Rakshit | G06F 30/20 |
| 2023/0127651 A1* | 4/2023 | Cella | G06N 3/045 |
| | | | 705/7.11 |
| 2023/0154240 A1* | 5/2023 | Browne | G06T 19/00 |
| | | | 701/29.4 |
| 2023/0195592 A1* | 6/2023 | Rakshit | G06F 11/3457 |
| | | | 703/21 |
| 2023/0315043 A1* | 10/2023 | B R | G05B 19/4065 |
| | | | 700/175 |

OTHER PUBLICATIONS

Alexopoulos et al. (Digital twin-driven supervised machine learning for the development of artificial intelligence applications in manufacturing, International Journal of Computer Integrated Manufacturing 2020, vol. 33, No. 5, 429-439) (Year: 2020).*

Liu et al. (Digital twin-based designing of the configuration, motion, control, and optimization model of a flow-type smart manufacturing system, Journal of Manufacturing Systems 58 (2021) 52-64) (Year: 2021).*

Mell et al., "The NIST Definition of Cloud Computing", NIST, Special Publication 800-145, Sep. 2011, 7 pages.

* cited by examiner

505　Identify activities of a machine using a digital twin of a machine

510　Run simulations of the activities on the digital twin

515　Determine a performance issue in the machine using the simulations

520　Deploy a capability to address the performance issue

MACHINE PERFORMANCE IDENTIFICATION AND ISSUE WORKAROUND

BACKGROUND

Aspects of the present invention relate generally to machines and, more particularly, to machine performance identification and issue workaround.

A machine is an apparatus which performs functions. In some machines these functions may include cutting, sorting, and stamping, amongst other features.

SUMMARY

In a first aspect of the invention, there is a computer-implemented method including: identifying, by a computing device, activities of a machine using a digital twin of a machine; running, by the computing device, simulations of the activities on the digital twin; determining, by the computing device, a performance issue in the machine using the simulations; and deploying, by the computing device, a capability to address the performance issue.

In another aspect of the invention, there is a computer program product including one or more computer readable storage media having program instructions collectively stored on the one or more computer readable storage media. The program instructions are executable to: identify activities of a machine using a digital twin of a machine; run simulations of the activities on the digital twin; determine a performance issue in the machine by comparing data from the simulations to historical data; and deploy a capability to address the performance issue.

In another aspect of the invention, there is system including a processor, a computer readable memory, one or more computer readable storage media, and program instructions collectively stored on the one or more computer readable storage media. The program instructions are executable to: identify activities of a machine using a digital twin of a machine; run simulations of the activities on the digital twin; determine a performance issue in the machine by comparing data from the simulations to historical data; determine an alternate machine to perform the activities to overcome the performance issue; and cause the alternate machine to perform the activities of the machine.

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Figure 1:
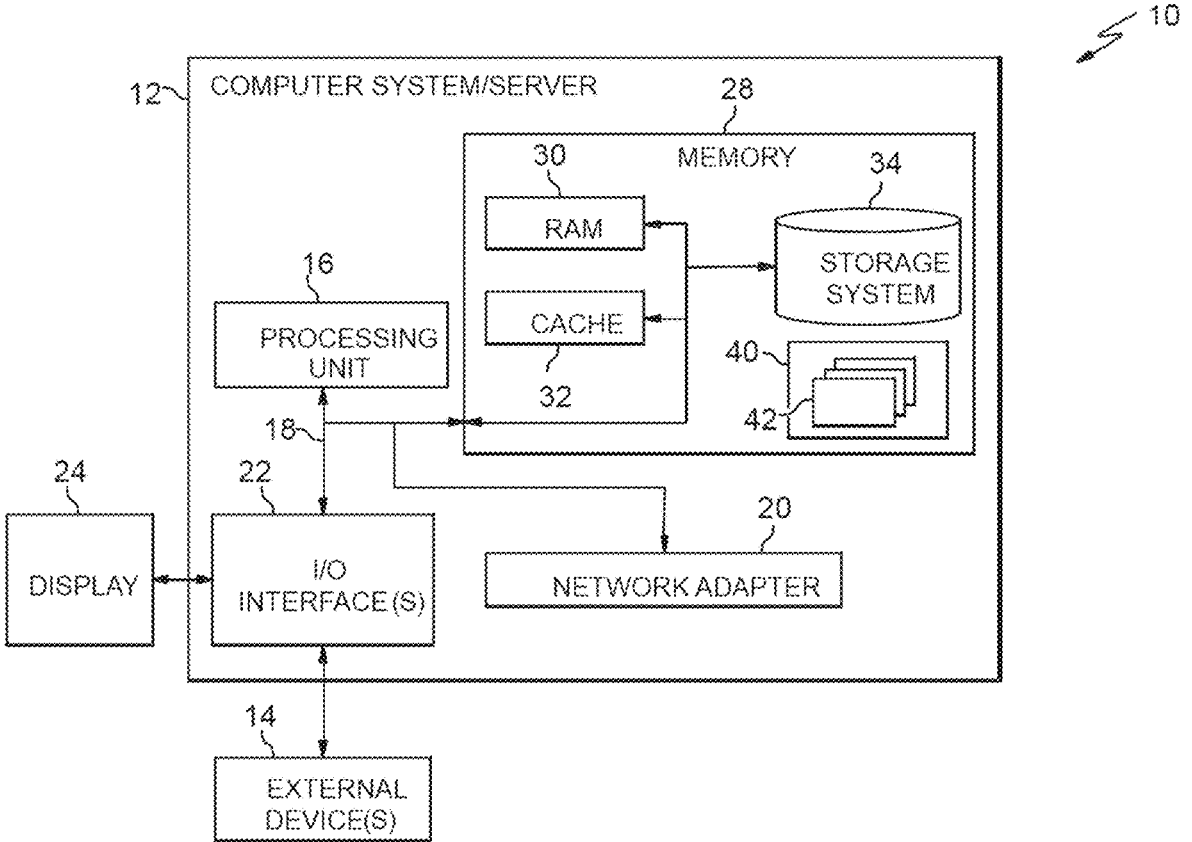
FIG. 1 depicts a cloud computing node according to an embodiment of the present invention.

Aspects of the present invention relate generally to machines and, more particularly, to machine performance identification and issue workaround. According to aspects of the invention, a system accesses a digital twin of a machine. In embodiments, the system runs simulations on the digital twin to determine performance issues and problems with the machine. In embodiments, performance issues include a suboptimal functioning of a machine or system or partial or a relatively substantial breakdown of the machine or system. In response to determining a performance issue, the system deploys a capability to address the performance issue. In this manner, implementations of the invention allow for a function of the machine to continue.

In embodiments, a system utilizes a digital twin simulation of equipment to identify and deploy workarounds to equipment issues occurring on a shop floor. In embodiments, when installing equipment or a machine in an industrial shop floor, before the equipment or machine goes into service for shop floor activities, the system creates a digital twin system. In embodiments, the digital twin system is up to date with real-time updates from the equipment or the machine. In embodiments, when issues arise with one or more parts of the equipment/machine, the system identifies backup machines or accessories to perform a similar functional activity. In this way, the shop floor operations can continue effectively using machines having a same effectiveness and configuration, thereby providing the quality of the physical activity while maintaining operational safety.

In embodiments, based on activities by one or more machines, the system performs a digital twin simulation of the one or more machines to identify a need for additional capabilities. In embodiments, the additional capabilities include: backup machines or devices; accessories or machine components; and alternate equipment, amongst other capabilities. In embodiments, the system analyzes: steps of a workflow; activity specifications; safety requirements; and quality requirements, amongst other features. In embodiments, the system considers external influencing factors (like wind forces, gravity, etc.) which can impact an activity. In embodiments, the system identifies what other types of accessories, backup or alternate machines are required to support the activity. In embodiments, based on digital twin simulation, the system identifies backup or alternate accessories, devices, or machines for deployment on the shop floor (like position, direction, distance, etc.) along with the existing machines on the shop floor for successful performance of activities.

In embodiments, based on the digital twin simulation, the system auto deploys the accessories, backup or replacement machines around the activity area, so that, with the aggregated capability of the machines, there is successful completion of the activity. In embodiments, to achieve the safety and quality of the activity, the system identifies how the backup accessory, replacement device, and/or machine performs with the existing shop floor machines Implementations of the invention provide improvements to machines by identifying vulnerabilities of the machines and deploying capabilities to address those vulnerabilities. Specifically, aspects of the invention access a digital twin of a machine and run simulations on the digital twin. In embodiments, using the simulations, a system identifies any vulnerabilities in the machine. In embodiments, in response to identifying a vulnerability, the system deploys a capability to address the vulnerability, so that the machine continues to perform. Accordingly, the system improves machines by identifying vulnerabilities in the machines and deploying capabilities to address those vulnerabilities, thereby allowing the machine to continue to perform in a same capacity as before as if the machine was available.

In addition, the steps for identifying vulnerabilities in machines are unconventional. In embodiments, aspects of the invention: a) identify activities of a machine using a digital twin of a machine; b) run simulations of the activities on the digital twin; c) determine a performance issue in the machine using the simulations; and d) deploy a capability to address the performance issue. These unconventional steps allow for identifying vulnerabilities in machines and providing capabilities to address these vulnerabilities.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium or media, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
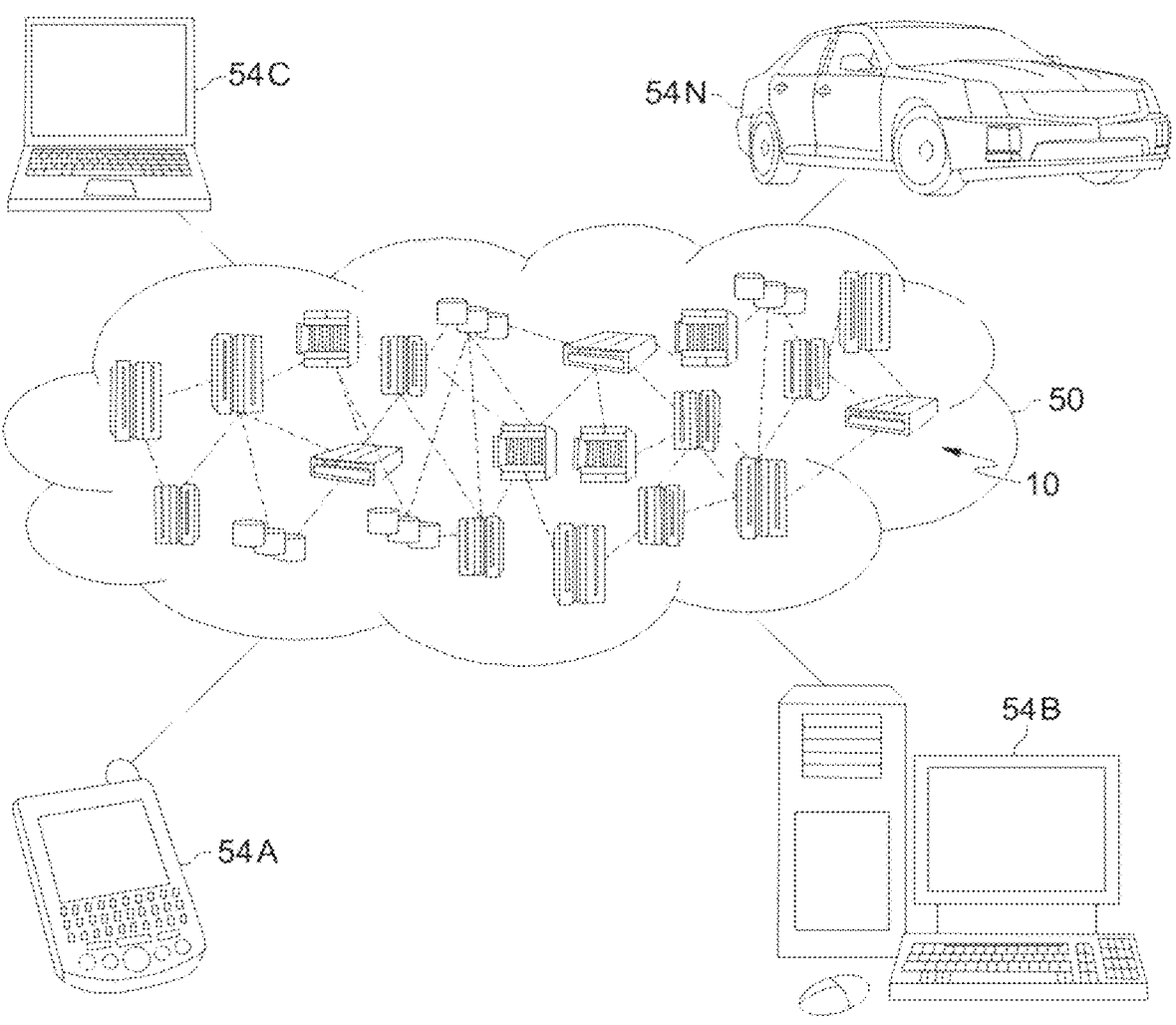
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
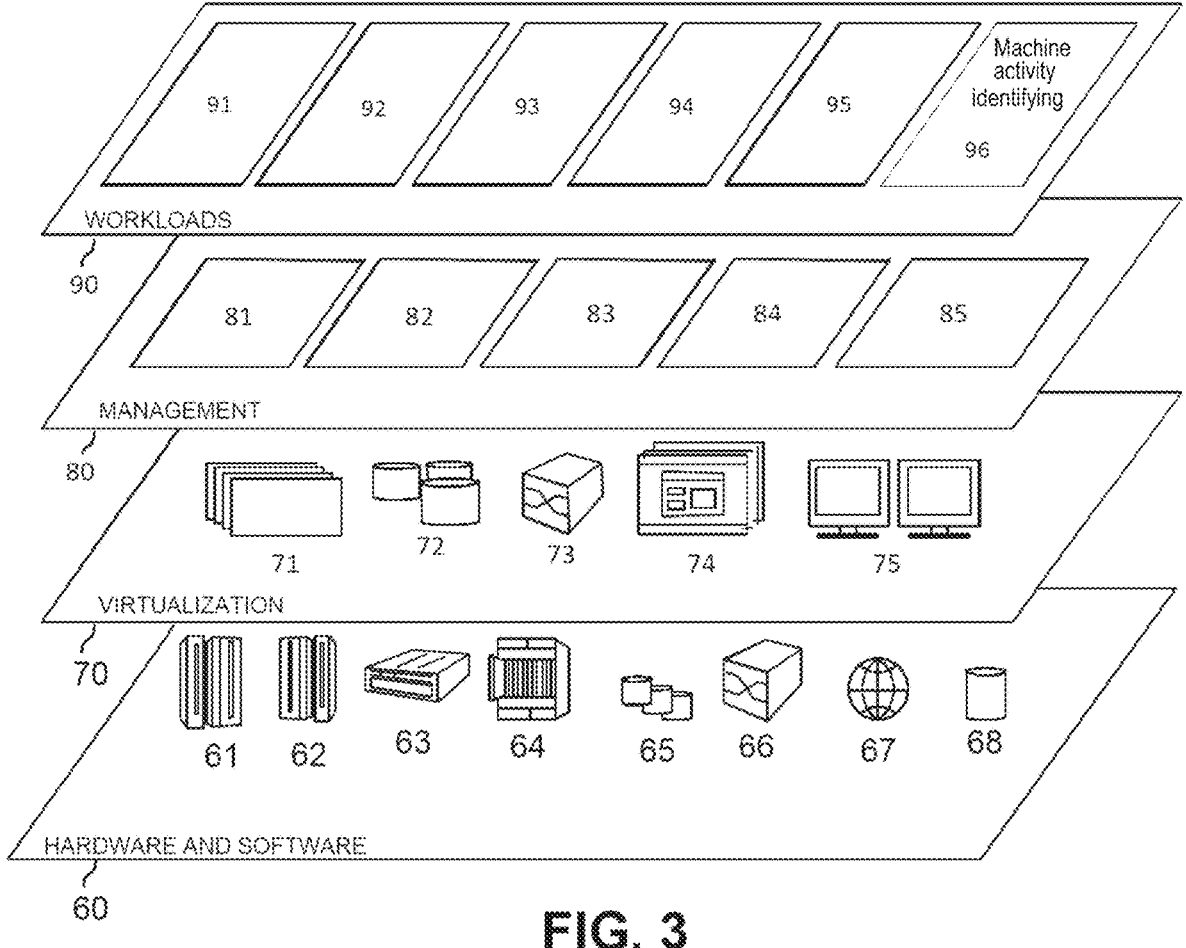
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and machine activity identifying 96.

Implementations of the invention may include a computer system/server 12 of FIG. 1 in which one or more of the program modules 42 are configured to perform (or cause the computer system/server 12 to perform) one of more functions of the machine activity identifying 96 of FIG. 3. For example, the one or more of the program modules 42 may be configured to: a) identify activities of a machine using a digital twin of a machine; b) run simulations of the activities on the digital twin; c) determine a performance issue in the machine using the simulations; and d) deploy a capability to address the performance issue.

Figure 4:
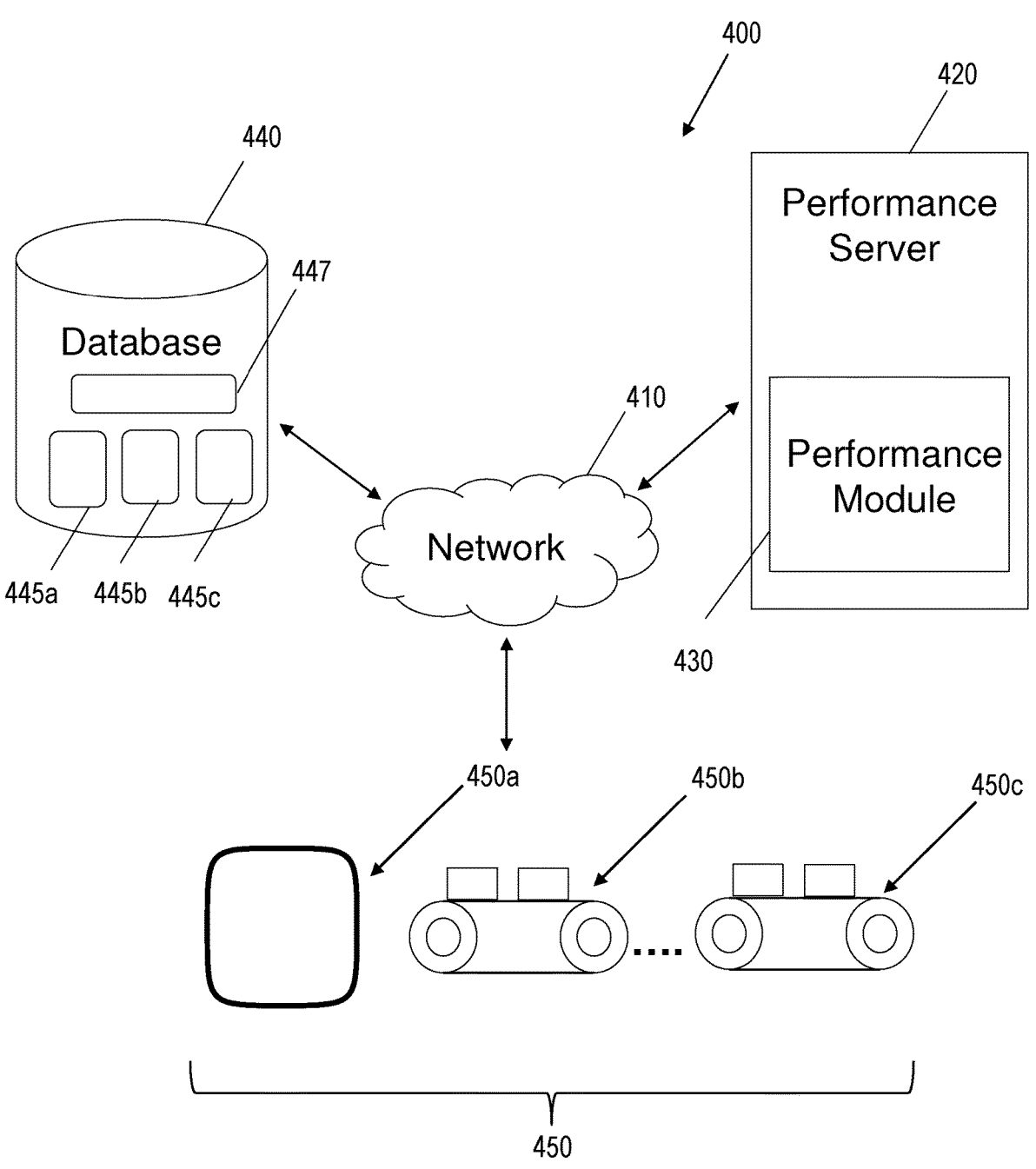
FIG. 4 shows a block diagram of an exemplary environment in accordance with aspects of the invention.

FIG. 4 shows a block diagram of an exemplary environment in accordance with aspects of the invention. In embodiments, the environment 400 includes a network 410, a performance server 420, a database 440, and machines 450. The performance server 420 is a computing device comprising one or more components of computer system/server 12 of FIG. 1. In embodiments, the machines 450 are physical apparatuses which perform functions in a manufacturing facility, e.g., automobile manufacturing facility. In embodiments, the machines 450 may be a measuring machine 450a and conveyor machines 450b, 450c, amongst other machines. Examples of other machines include a boring machine and a cutting machine.

In embodiments, the performance server 420 comprises a performance module 430, which comprises one or more program modules such as program modules 42 described with respect to FIG. 1. The performance server 420 may include additional or fewer modules than those shown in FIG. 4. In embodiments, separate modules may be integrated into a single module. Additionally, or alternatively, a single module may be implemented as multiple modules. Moreover, the quantity of devices and/or networks in the environment 400 is not limited to what is shown in FIG. 4. In practice, the environment 400 may include additional devices and/or networks; fewer devices and/or networks; different devices and/or networks; or differently arranged devices and/or networks than illustrated in FIG. 4.

In embodiments, the network 410 is any suitable network including any combination of one or more of a LAN, WAN, or the Internet. In a particular embodiment, the network 410 is representative of a cloud computing environment 50 as described in FIG. 2.

In embodiments, the database 440 includes the digital twins 445a, 445b, 445c of the machines 450a, 450b, 450c. In embodiments, each digital twin of the digital twins 445a, 445b, 445c is a virtual representation of the machines 450a, 450b, 450c that remains in existence through lifecycles of the machines 450a, 450b, 450c. Specifically, the digital twin is a virtual counterpart of a machine and includes software representing each component of the machine. In embodiments, the digital twin gets information continuously from the machine so that the digital twin is up to date. In embodiments, the digital twin allows for simulations to determine effects on the machine to help with decision-making with regards to the operation and use of the machine.

In embodiments, the manufacturer of the machines 450a, 450b, 450c creates the digital twins 445a, 445b, 445c.

In embodiments, the machines 450a, 450b, 450c include sensors which take measurements of different parameters of the machines 450a, 450b, 450c as the machines 450a, 450b, 450c perform functions. Examples of the sensors include thermal sensors, audible sensors, and position sensors, amongst other examples. Examples of the data from these sensors include heat from the machine of the machines 450a, 450b, 450c, noise levels of the machines 450a, 450b, 450c, and the positioning of components of the machines 450a, 450b, 450c, as functions of the machines 450a, 450b, 450c occur. In embodiments, the data from the sensors are sent to the digital twins 445a, 445b, 445c through the network 410. In this way, each digital twin of the digital twins 445a, 445b, 445c is kept up to date with real-time updates from the machines 450a, 450b, 450c, so that the digital twins 445a, 445b, 445c mimic the machines 450a, 450b, 450c and the activities of the machines 450a, 450b, 450c. Accordingly, a digital twin receives continuous updates from sensors on the machine.

In embodiments, each digital twin of the digital twins 445a, 445b, 445c includes a manufacturer knowledge base. In embodiments, the manufacturer knowledge base includes manufacturer instructions, and manufacturer specifications, amongst other information. Specific examples of information include, operating manual, maintenance requirements, components present in the machines 450a, 450b, 450c, and replacement parts, amongst other examples.

In embodiments, during the lifetime of the machines 450a, 450b, 450c, the machines may run into some functional issues due to wear and tear or malfunctioning parts. To address these issues, the performance module 430 begins by identifying functions of the machines 450a, 450b, 450c. To identify the functions, the performance module 430 implements a learning phase.

In embodiments, during the learning phase, the performance module 430 uses machine learning to learn which activities the machines 450a, 450b, 450c perform. Specifically, the performance module 430 accesses the digital twins 445a, 445b, 445c and collects data from the digital twins 445a, 445b, 445c. In embodiments, the performance module 430 uses this data from the digital twins 445a, 445b, 445c as training data for the learning phase. In embodiments, a manager of the manufacturing facility grants access to the performance module 430 to access the digital twins 445a, 445b, 445c. In embodiments, the performance module accesses the digital twins 445a, 445b, 445c through the network 410.

In embodiments, the data the performance module 430 collects from the digital twins 445a, 445b, 445c includes the data from the sensors and from the manufacturer knowledge bases within the digital twins 445a, 445b, 445c. In embodiments, the data from the manufacturer knowledge bases of the digital twins 445a, 445b, 445c includes manufacturer specifications, operating manuals, maintenance requirements, components present in the machines 450a, 450b, 450c, replacement parts, amongst other examples. In this way, from the sensor data and the manufacturer knowledge bases, the performance module 430 learns the activities of the machines 450a, 450b, 450c, including steps of a workflow for each machine, activity specifications, safety requirements, quality requirements. In addition, the sensor data allows the performance module 430 to consider external factors influencing the activities of the machines 445a, 445b, 445c, e.g., wind forces, gravity, etc. As an example, the performance module 430 collects data indicating that wheels of the conveyor machine 450b rotate one revolution per minute (rpm) over a specific time period as an activity of the conveyor machine 450b. As another example, the performance module 430 collects data from the manufacturer knowledge base of the digital twin 445a that the measuring machine 450a includes a laser and a replacement part for this laser.

In embodiments, as the machines continue to function, the performance module 430 continues to collect data from the digital twins 445a, 445b, 445c, thereby growing the training data. In embodiments, the training data becomes a part of a knowledge corpus 447 of the performance module 430. In embodiments, the knowledge corpus 447 is in the database 440 and includes historical data from the sensors, a map of the manufacturing facility, and an inventory of accessories and parts within the manufacturing facility for the machines 450a, 450b, 450c, amongst other features. In embodiments, the map includes position, direction, and distance of each machine of the machines 450a, 450b, 450c in the manufacturing facility. In embodiments, the knowledge corpus 447 includes quality and safety data for each machine of the machines 450a, 450b, 450c. In further embodiments, the knowledge corpus 447 receives the quality and safety data and the inventory and maps from a manager of the manufacturing facility. In embodiments, the performance module 430 accesses the knowledge corpus 447 through the network 410.

In embodiments, the learning phase also includes the performance module 430 learning which, if any, of the machines 450a, 450b, 450c, match other machines in the manufacturing facility. In embodiments, the performance module 430 determines there is a match between text in an operating manual of conveyor machine 450b to an operating manual of conveyor machine 450c. In embodiments, the performance module 430 uses natural language processing (NLP) techniques to interpret the text.

In embodiments, in response to learning the functions of the machines 450a, 450b, 450c, the performance module 430 runs simulations on the digital twins 445a, 445b, 445c. In embodiments, the performance module 430 changes parameters in the digital twin of the digital twins 445a, 445b, 445c to simulate an operating condition. As an example, the performance module 430 changes the parameters of the wheels of the conveyor machine 450c to simulate the rotation of the wheels of the conveyor machine 450c over a weeklong time period. As another example, the performance module 430 changes parameters to simulate measuring by the laser of the measuring tool 450a a number of times.

In embodiments, using the simulations on the digital twins 445a, 445b, 445c, the performance module 430 determines whether there will be any performance issues in the machines 450a, 450b, 450c. In embodiments, the performance module 430 determines a performance issue occurs by comparing the data from the simulation to historical data in the knowledge corpus 447. As an example, the historical data indicates that the wheels of the conveyor 450c rotate one rpm. However, the data from the simulation on the digital twin 445c indicates that the wheels are moving at a different rpm, e.g., one-half rpm. In embodiments, in response to the performance module 430 determining there is no match between the simulation data and the historical data, the performance module 430 determines a performance issue will occur. In this example, the performance module 430 determines that a performance issue exists with the wheels of the conveyor machine 450c.

In embodiments, in addition to or instead of using the simulations on the digital twins 445a, 445b, 445c, the performance module 430 determines a performance issue occurs by using the data from the sensors of the digital twins 445a, 445b, 445c and comparing the data from the sensors to historical data in the knowledge corpus 447. As an example, by accessing the digital twin 445a, the performance module 430 determines the motion data from a sensor on a robotic arm of the measuring machine 450a which includes a laser to measure. In this example, the motion data from the sensor is zero. In embodiments, the performance module 430 compares this motion data to the historical data, which indicates that motion should not be zero. In response to determining there is no match between the sensor data and the historical data, the performance module 430 determines that there is a performance issue at the arm of the measuring machine 450a.

In embodiments, in response to determining there is a performance issue by running simulations on the digital twins 445a, 445b, 445c and/or by comparing sensor data to historical data, the performance module 430 deploys a capability to address the performance issue. Specifically, the performance module 430 identifies types of alternate machines, accessories, or backups which support an aggregated capability of the activities, e.g., cutting, sorting, of the machine having the performance issue. In this way, the performance module 430 deploys a capability which includes identifying an alternate machine which matches an aggregated capability of the machine. As an example, the performance module 430 determines there is a performance issue with the conveyor machine 450b since the wheels of the conveyor machine 450b are not running at the rpm of the historical data in the knowledge corpus 447. In embodiments, using the knowledge corpus 447, the performance module 430 determines that conveyor machine 450c is the same model as the conveyor machine 450b because of the matching syntax of the operating manuals of the conveyor machine 450b and conveyor machine 450c. In embodiments, in response to determining the alternate machine, the performance module causes a production line to shift from using conveyor machine 450b to conveyor machine 450c. In this way, the performance module 430 causes the alternate machine, i.e., conveyor machine 450c, to perform the activities of the machine, i.e., conveyor machine 450b. Accordingly, the performance module 430 addresses the performance issue by identifying an alternate machine to perform the activities of the machine having the performance issue.

In embodiments, in addition to or instead of identifying an alternate machine, the performance module 430 also deploys accessories in response to determining a performance issue. In embodiments, to deploy the accessory, the performance module 430 uses the manufacturer's knowledge base to determine the accessory for the machine of the machines 450a, 450b, 450c. In response to determining the accessory, the performance module 430 uses the inventory in the knowledge corpus 447 to determine whether the inventory contains the accessory. In this way, the performance module 430 checks an inventory for the accessory.

In embodiments, in response to the inventory containing the accessory, the performance module 430 deploys the accessory to the machine of the machines 450a, 450b, 450c by using the map of the manufacturing facility in the knowledge corpus 447. As an example, the performance module 430 determines there is a performance issue with the measuring machine 450a. As a further example, there is an issue with the laser of the measuring machine 450a. In embodiments, the performance module 430 determines from the manufacturer's knowledge base the laser part the measuring machine 450a utilizes. In embodiments, in response to determining the laser part for the measuring machine 450a, the performance module 430 checks the inventory in the knowledge corpus 447 to determine whether the inventory in the knowledge corpus 447 includes the laser part. In response to determining the laser part is in the inventory, the performance module 430 deploys the laser part using the map in the knowledge corpus 447. In embodiments, the performance module 430 deploys the laser part using a vehicle, e.g., automated guided cart.

In embodiments, in addition to or instead of identifying the alternate machine and/or deploying the accessory, the performance module 430 sends a message to a user of a machine with the performance issue. As an example, the performance module 430 determines there is a performance issue with the conveyor machine 450b. In response to determining there is a performance issue, the performance module 430 sends a message to the user indicating the machine has a performance issue. In embodiments, the message also includes an alternate machine and/or an accessory to the machine to address the performance issue. In embodiments, the performance module 430 sends the message to the user through the network 410.

Figure 5:
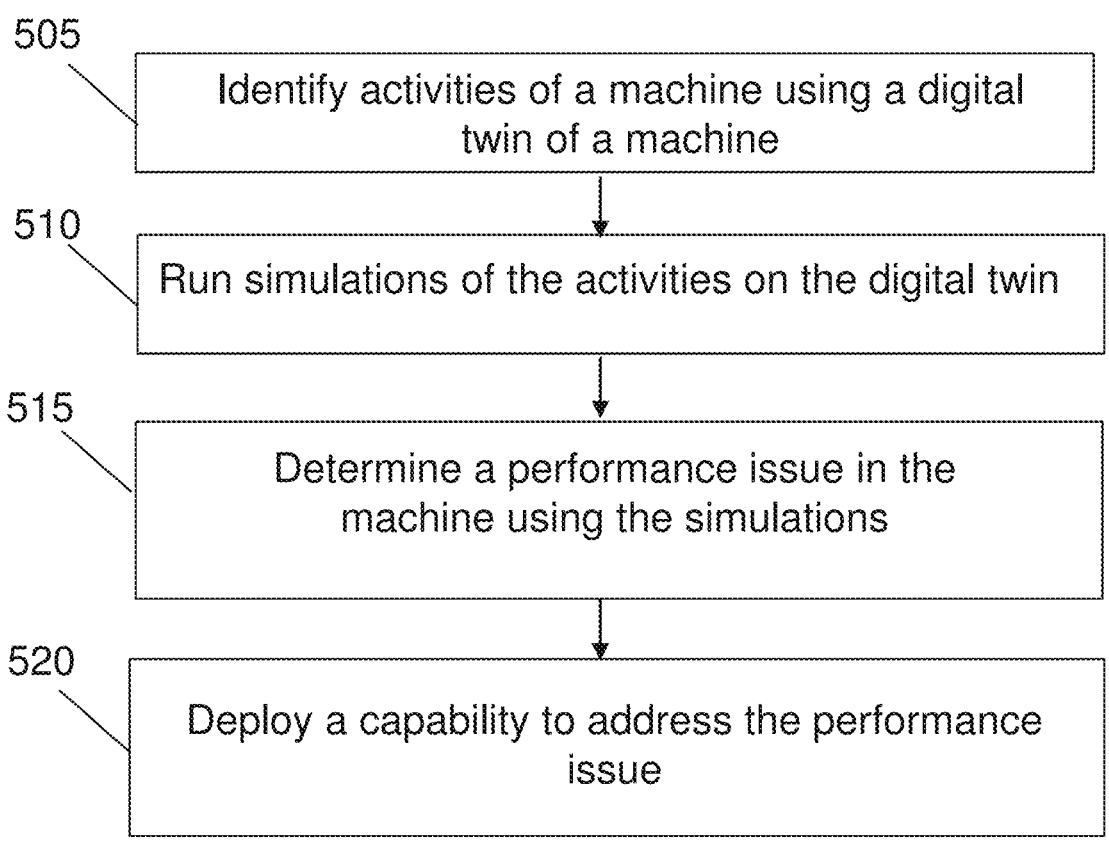
FIG. 5 shows a flowchart of an exemplary method in accordance with aspects of the invention.

FIG. 5 shows a flowchart of an exemplary method in accordance with aspects of the present invention. Steps of the method may be carried out in the environment of FIG. 4 and are described with reference to elements depicted in FIG. 4.

At step 505, the system identifies activities of a machine using a digital twin of a machine. In embodiments, and as described with respect to FIG. 4, the performance module 430 identifies the activities of a machine of the machines 450a, 450b, 450c by accessing a digital twin of the digital twins 445a, 445b, 445c. In embodiments, the performance module 430 uses the digital twin to collect sensor data from the machines 450a, 450b, 450c and to access a manufacturer knowledge base within the digital twin.

At step 510, the system runs simulations of the activities on the digital twin. In embodiments, and as described with respect to FIG. 4, the performance module 430 runs simulations of the activities on the digital twin by changing parameters of the digital twin of the digital twins 445a, 445b, 445c.

At step 515, the system determines a performance issue in the machine using the simulations. In embodiments, and as described with respect to FIG. 4, the performance module 430 determines a performance issue by comparing the simulation data to historical data in the knowledge corpus 447. In embodiments, in response to the simulation data not matching the historical data, the performance module 430 determines there is a performance issue.

At step 520, the system deploys a capability to address the performance issue. In embodiments, and as described with respect to FIG. 4, the performance module 430 deploys a capability to address the performance issue by using an alternate machine of the machines 450a, 450b, 450c. In further embodiments, the performance module 430 deploys an accessory to address the performance issue.

In embodiments, a service provider could offer to perform the processes described herein. In this case, the service provider can create, maintain, deploy, support, etc., the computer infrastructure that performs the process steps of the invention for one or more customers. These customers may be, for example, any business that uses technology. In return, the service provider can receive payment from the customer(s) under a subscription and/or fee agreement and/ or the service provider can receive payment from the sale of advertising content to one or more third parties.

In still additional embodiments, the invention provides a computer-implemented method, via a network. In this case, a computer infrastructure, such as computer system/server 12 (FIG. 1), can be provided and one or more systems for performing the processes of the invention can be obtained (e.g., created, purchased, used, modified, etc.) and deployed to the computer infrastructure. To this extent, the deployment of a system can comprise one or more of: (1) installing program code on a computing device, such as computer system/server 12 (as shown in FIG. 1), from a computer-readable medium; (2) adding one or more computing devices to the computer infrastructure; and (3) incorporating and/or modifying one or more existing systems of the computer infrastructure to enable the computer infrastructure to perform the processes of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

identifying, by a computing device, activities including steps of a workflow of a machine by performing machine learning on data of a digital twin of the machine;

running, by the computing device, simulations of the activities on the digital twin;

determining, by the computing device, a performance issue in the machine using the simulations;

deploying, by the computing device, a capability to address the performance issue which includes identifying an alternate machine which has an operating manual which matches a syntax of the operating manual of the machine; and performing, by the computing device, the activities of the machine by shifting a production line to the alternative machine to address the performance issue in the machine.

2. The method of claim 1, wherein the running the simulations of the activities includes changing parameters of wheels of the machine to simulate rotation of the wheels of the machine.

3. The method of claim 1, wherein the digital twin is a virtual representation of the machine.

4. The method of claim 1, further comprising training a machine learning model using data from the digital twin to form a knowledge corpus.

5. The method of claim 4, wherein the knowledge corpus includes historical data of the activities.

6. The method of claim 5, wherein the determining the performance issue occurs in response to determining that there is no match between the historical data to data from the simulations.

7. The method of claim 1, wherein the digital twin receives continuous updates from sensors on the machine.

8. The method of claim 7, further comprising determining the performance issue in the machine by comparing data from the sensors to historical data in a knowledge corpus.

9. The method of claim 1, wherein the deploying the capability includes deploying an accessory to the machine.

10. The method of claim 9, further comprising checking an inventory for the accessory.

11. The method of claim 1, wherein the computing device includes software provided as a service in a cloud environment.

12. A computer program product comprising one or more computer readable storage media having program instructions collectively stored on the one or more computer readable storage media, the program instructions executable to:

identify activities including steps of a workflow of a machine by performing machine learning on data of a digital twin of the machine;

run simulations of the activities on the digital twin;

determine a performance issue in the machine by comparing data from the simulations to historical data; and deploy a capability to address the performance issue which includes identifying an alternate machine which has an operating manual which matches a syntax of the operating manual of the machine; and perform the activities of the machine by shifting a production line to the alternative machine to address the performance issue in the machine.

13. The computer program product of claim 12, wherein the machine is a conveyor machine, and the running the simulations of the activities includes changing parameters of wheels of the machine to simulate rotation of the wheels of the machine.

14. The computer program product of claim 12, wherein the determining the performance issue occurs in response to determining that there is no match between the historical data to data from the simulations.

15. A system comprising:

a processor, a computer readable memory, one or more computer readable storage media, and program instructions collectively stored on the one or more computer readable storage media, the program instructions executable to:

identify activities including steps of a workflow of a machine by performing machine learning on data of a digital twin of the machine;

run simulations of the activities on the digital twin;

determine a performance issue in the machine by comparing data from the simulations to historical data;

determine an alternate machine to perform the activities to overcome the performance issue by identifying the alternate machine which matches the machine; and cause a shift in a production line to the alternate machine to perform the activities of the machine to address the performance issue in the machine.

16. The system of claim 15, wherein the running the simulations of the activities includes changing parameters of wheels of the machine to simulate rotation of the wheels of the machine.

17. The system of claim 15, wherein the digital twin is a virtual representation of the machine, the determining the performance issue occurs in response to determining that there is no match between the historical data to data from the simulations.

18. The system of claim 15, wherein the digital twin receives continuous updates from sensors on the machine.

\* \* \* \* \*